United States Patent
Kim et al.

(10) Patent No.: US 11,003,370 B2
(45) Date of Patent: May 11, 2021

(54) SYSTEM ON CHIP PERFORMING A PLURALITY OF TRAININGS AT THE SAME TIME, OPERATING METHOD OF SYSTEM ON CHIP, ELECTRONIC DEVICE INCLUDING SYSTEM ON CHIP

(71) Applicant: Samsung Electronics Co., Ltd., Suwon-si (KR)

(72) Inventors: Yongseob Kim, Hwaseong-si (KR); Minho Seo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 136 days.

(21) Appl. No.: 16/457,164

(22) Filed: Jun. 28, 2019

(65) Prior Publication Data

US 2020/0133542 A1    Apr. 30, 2020

(30) Foreign Application Priority Data

Oct. 30, 2018    (KR) ........................ 10-2018-0130848

(51) Int. Cl.
*G06F 12/02*    (2006.01)
*G06F 3/06*    (2006.01)
(Continued)

(52) U.S. Cl.
CPC .......... *G06F 3/0632* (2013.01); *G06F 3/0604* (2013.01); *G06F 3/0653* (2013.01);
(Continued)

(58) Field of Classification Search
CPC .... G06F 3/0632; G06F 3/0673; G06F 3/0604; G06F 3/0653; G06F 3/0659;
(Continued)

(56) References Cited

U.S. PATENT DOCUMENTS

| 6,703,879 B2 | 3/2004 | Okuda et al. |
| 8,665,665 B2 | 3/2014 | Huang |

(Continued)

FOREIGN PATENT DOCUMENTS

| CN | 102737718 A | 10/2012 |
| KR | 10-0764111 | 10/2007 |

(Continued)

*Primary Examiner* — Charles Rones
*Assistant Examiner* — Tong B. Vo
(74) *Attorney, Agent, or Firm* — Harness, Dickey & Pierce, P.L.C.

(57) ABSTRACT

A system on chip includes a clock generator that adjusts a duty cycle of a clock to be output to a memory device depending on a first code, a reference voltage generator that adjusts a level of a reference voltage used to determine a first data input/output signal output from the memory device depending on a second code, a data receiver that aligns a first data strobe signal and the first data input/output signal output from the memory device, when one of the first code and the second code is changed, and a training circuit that calculates a plurality of read valid window margins for a plurality of combinations of the first code and the second code based on the first data strobe signal and the first data input/output signal.

20 Claims, 10 Drawing Sheets

(51) Int. Cl.
*G06F 12/1009* (2016.01)
*G11C 11/4076* (2006.01)
*G11C 11/4074* (2006.01)
*G11C 11/4096* (2006.01)
*G11C 11/56* (2006.01)
*G06F 11/07* (2006.01)
*G06F 1/10* (2006.01)
*H03M 13/09* (2006.01)

(52) U.S. Cl.
CPC .......... *G06F 3/0659* (2013.01); *G06F 3/0673* (2013.01); *G11C 11/4074* (2013.01); *G11C 11/4076* (2013.01); *G11C 11/4096* (2013.01)

(58) Field of Classification Search
CPC ............. G06F 15/7807; G11C 11/4076; G11C 11/4074; G11C 11/4096; G11C 7/1066; G11C 2207/2254; G11C 7/1093; G11C 11/4093; G06N 20/00
See application file for complete search history.

(56) References Cited

U.S. PATENT DOCUMENTS

| | | | |
|---|---|---|---|
| 8,692,561 B2* | 4/2014 | Cordero | G06F 1/10 324/601 |
| 8,823,433 B2 | 9/2014 | Cha et al. | |
| 9,818,471 B1 | 11/2017 | Oh et al. | |
| 9,967,083 B2 | 5/2018 | Yabe et al. | |
| 2002/0196883 A1* | 12/2002 | Best | G11C 7/10 375/355 |
| 2006/0245519 A1* | 11/2006 | Cheng | H04L 25/20 375/316 |
| 2013/0223152 A1 | 8/2013 | Passerini et al. | |
| 2013/0249612 A1* | 9/2013 | Zerbe | G11C 7/222 327/161 |
| 2014/0047158 A1* | 2/2014 | Frans | G06F 3/0613 711/102 |
| 2014/0265885 A1* | 9/2014 | Hu | H05B 45/48 315/186 |
| 2018/0277194 A1* | 9/2018 | Hiraishi | G11C 7/222 |
| 2018/0294802 A1* | 10/2018 | Swanson | H04L 25/14 |
| 2018/0375692 A1* | 12/2018 | Wieduwilt | H04L 25/0278 |
| 2019/0172516 A1 | 6/2019 | Kim | |
| 2019/0187929 A1* | 6/2019 | Srivastava | G06F 3/0659 |
| 2019/0199557 A1* | 6/2019 | Taylor | H04L 25/03057 |
| 2019/0311773 A1* | 10/2019 | Jimenez-Olivares | G11C 29/021 |
| 2020/0020362 A1* | 1/2020 | Bae | G06F 3/0604 |

FOREIGN PATENT DOCUMENTS

| | | |
|---|---|---|
| KR | 10-0834397 | 6/2008 |
| KR | 10-1140141 | 5/2012 |
| KR | 2019-0065789 A | 6/2019 |

* cited by examiner

SYSTEM ON CHIP PERFORMING A PLURALITY OF TRAININGS AT THE SAME TIME, OPERATING METHOD OF SYSTEM ON CHIP, ELECTRONIC DEVICE INCLUDING SYSTEM ON CHIP

CROSS-REFERENCE TO RELATED APPLICATIONS

This application claims priority under 35 U.S.C. § 119 to Korean Patent Application No. 10-2018-0130848 filed on Oct. 30, 2018, in the Korean Intellectual Property Office, the disclosure of which is incorporated by reference herein in its entirety.

BACKGROUND

Example embodiments of the inventive concepts described herein relate to a system on chip performing a plurality of trainings at the same time, an operating method of the system on chip, and/or an electronic device including the system on chip.

A system on chip (hereinafter referred to as a "SoC") is an integrated circuit in which a plurality of components and/or a plurality of intellectual properties (IPs) of an electronic system are integrated. The SoC may communicate with a memory device outside the SoC. In recent years, as operating speeds of the SoC and/or the memory device increase, respectively, the SoC should perform a plurality of trainings on the memory device before communicating with the memory device at a high speed.

The SoC may perform, for example, ZQ calibration, reference voltage training, read training, write training, clock duty cycle training, etc. on the memory device. However, since the above-described trainings depend on each other, a result of trainings performed by the SoC may not be preferred or optimum due to an order in which the trainings are performed.

SUMMARY

Example embodiments of the inventive concepts provide a system on chip performing a plurality of trainings at the same time, an operating method of the system on chip, and/or an electronic device including the system on chip.

According to some example embodiments, a system on chip may include a clock generator that adjusts a duty cycle of a clock to be output to a memory device depending on a first code, a reference voltage generator that adjusts a first level of a first reference voltage used to determine a first data input/output signal output from the memory device depending on a second code, a data receiver that aligns a first data strobe signal and the first data input/output signal output from the memory device, when one of the first code and the second code is changed, and a processor configured to calculate a plurality of read valid window margins for a plurality of combinations of the first code and the second code based on the first data strobe signal and the first data input/output signal.

According to some example embodiments, an operating method of a system on chip connected with a memory device may include changing one of a first code for adjusting a duty cycle of a clock to be provided to the memory device and a second code for adjusting a first level of a first reference voltage of the system on chip used to determine a first data input/output signal output from the memory device, aligning a first data strobe signal and the first data input/output signal output from the memory device, calculating a plurality of read valid window margins for a plurality of combinations, each one of the plurality of combinations being a pair of one of values of the first code and one of values of the second code, based on the first data strobe signal and the first data input/output signal, setting the duty cycle of the clock based on a first target value of the first code corresponding to a maximum read valid window margin of the plurality of read valid window margins, and setting the first level of the first reference voltage of the system on chip based on a second target value of the second code corresponding to the maximum read valid window margin of the plurality of read valid window margins.

According to some example embodiments, an electronic device may include a system on chip configured to generate a clock, and a memory device synchronized with an output from the clock output. The system on chip may be configured to simultaneously perform a first training of a duty cycle of the clock adjusted according to a first code, a second training of a first level of a first reference voltage of the system on chip which is adjusted according to a second code and is used to determine a first data input/output signal output from the memory device, and/or a third training of a first skew between a first data strobe signal and the first data input/output signal output from the memory device.

DETAILED DESCRIPTION

Below, some example embodiments of the inventive concepts will be described in detail and clearly to such an extent that one of ordinary skill in the art may easily implement the inventive concepts.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. The term "and/or" includes each of the mentioned items and one or more combinations.

Figure 1:
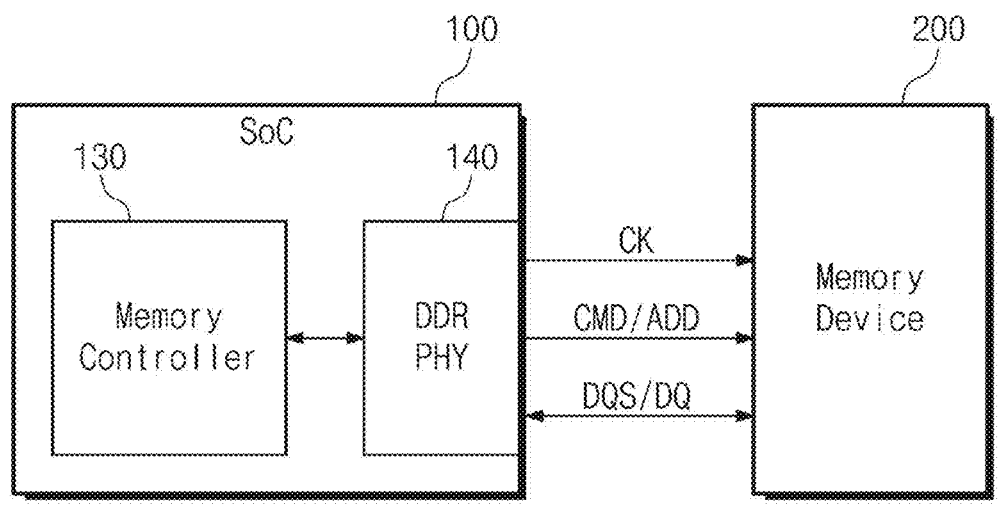
FIG. 1 illustrates a block diagram of an electronic device according to some example embodiments of the inventive concepts.

FIG. 1 illustrates a block diagram of an electronic device according to some example embodiments of the inventive concepts. An electronic device 10 may include a system on chip (hereinafter referred to as a "SoC") 100 and a memory device 200. The electronic device 10 may be also referred to as an "electronic system". For example, the electronic device 10 may be a desktop computer, a laptop computer, a workstation, a server, a mobile device, etc.

The SoC 100 which is an application processor (AP) may control overall operations of the electronic device 10. The SoC 100 may execute a program depending on an application which the electronic device 10 supports, and/or may receive data associated with program execution from the memory device 200 and/or may send a result of the program execution to the memory device 200. The SoC 100 may include various intellectual properties (IPs). For example, SoC 100 may include a memory controller 130 and/or a double data rate physical layer (hereinafter referred to as a "DDR PHY") 140. The memory controller 130 may include hardware including logic circuits; a hardware/software combination such as a processor executing software; or a combination thereof. For example, the memory controller 130 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory controller 130 may control the memory device 200 through the DDR PHY 140. For example, the memory controller 130 and the DDR PHY 140 may communicate with each other depending on a DDR PHY interface (DFI). The memory controller 130 may generate commands and addresses for accessing the memory device 200. The memory controller 130 may generate data to be stored to the memory device 200. The memory controller 130 may receive data stored in the memory device 200.

The DDR PHY 140 may be also referred to as a "DDR PHY interface". The DDR PHY 140 may send a clock CK, and a command and address CMD/ADD to the memory device 200 under control of the memory controller 130. The DDR PHY 140 may send a data strobe signal (hereinafter referred to as a "DQS") and a data input/output signal (hereinafter referred to as a "DQ") to the memory device 200 under control of the memory controller 130. The DQS may be used to sample the DQ. The DDR PHY 140 may receive the DQS and the DQ from the memory device 200. Paths which are used to send the DQS and the DQ from DDR PHY 140 to the memory device 200 and/or paths which are used to send the DQS and the DQ from the memory device 200 to the DDR PHY 140 may be identical to each other and/or may be shared. Since the DQS and the DQ are bidirectional signals, the DQS and the DQ which are output from the SoC 100 to the memory device 200 may be referred to as a write DQS and a write DQ, respectively, and the DQS and the DQ which are output from the memory device 200 to the SoC 100 may be referred to as a read DQS and a read DQ, respectively.

Depending on a request of the SoC 100, the memory device 200 may store data or may provide data stored therein to the SoC 100. The memory device 200 may communicate with the SoC 100 through DDR PHY 140. For example, the memory device 200 may be a dynamic random access memory (DRAM) device, a static random access memory (SRAM) device, a thyristor random access memory (TRAM) device, a NAND flash memory device, a NOR flash memory device, a resistive random access memory (RRAIVI) device, a ferroelectric random access memory (FRAM) device, a phase change random access memory (PRAM) device, a magnetic random access memory (MRAM) device, a solid state drive (SSD), a memory card, universal flash storage (UFS), etc. Below, a description will be given as the memory device 200 is a DRAM device synchronized with the clock CK output from the SoC 100 (e.g., a synchronous dynamic random access memory (SDRAM) device).

For example, a plurality of system on chips 100 may be manufactured through any manufacturing process, and/or a plurality of memory devices 200 may be manufactured of any other manufacturing process. The plurality of system on chips 100 may have various operating characteristics (e.g., an operating speed, power consumption, etc.), and/or the plurality of memory devices 200 may have various operating characteristics. One of the plurality of system on chips 100 and/or one of the plurality of memory devices 200 may be mounted on or used in the electronic device 10. Since the SoC 100 has various operating characteristics (e.g., fast, typical, slow, etc.) and the memory device 200 also has various operating characteristics (e.g., fast, typical, slow, etc.), for the SoC 100 and the memory device 200 mounted on the electronic device 10 to communicate with each other, training between the SoC 100 and the memory device 200 mounted on the electronic device 10 is necessary (e.g., training of an on the fly manner). Also, since the memory device 200 operates based on the clock CK sent from the SoC 100, training of a duty cycle (or a duty ratio) of the clock CK is necessary. For example, an ideal value of the duty cycle of the clock CK may be 50% (e.g., a duration corresponding to logic "1" of the clock CK may be identical to a duration corresponding to logic "0" of the clock CK).

Figure 2:
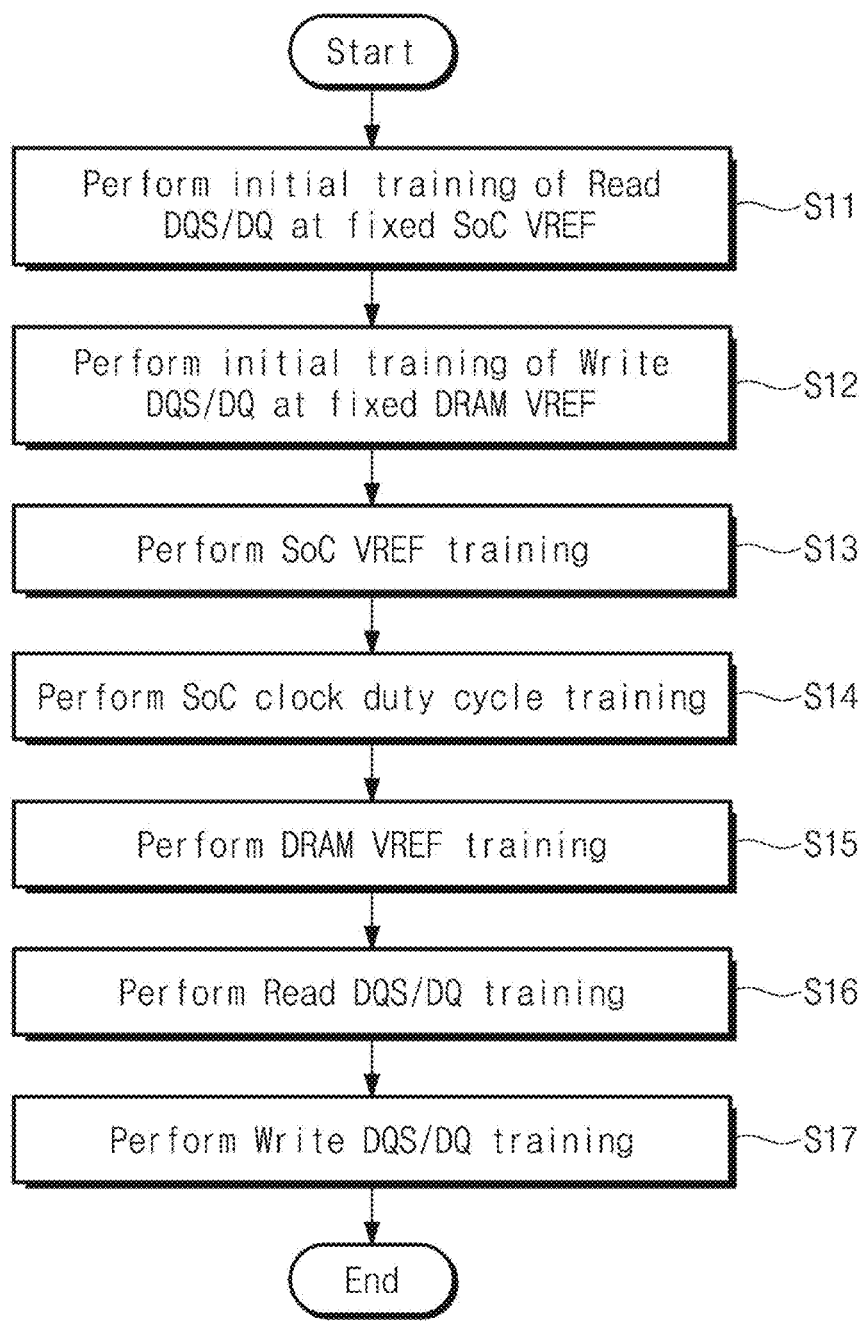
FIG. 2 illustrates a flowchart of a training between a SoC and a memory device of FIG. 1.

FIG. 2 illustrates a flowchart of a training between a SoC and a memory device of FIG. 1. For example, the training between the SoC 100 and the memory device 200 may include a training of a skew between the read DQS and the read DQ, a training of a level of a reference voltage VREF of the SoC 100 used to determine the read DQ, a training of a duty cycle of the clock CK, and/or a training of a skew between a write DQS and a write DQ, and/or a training of a level of a reference voltage VREF of the memory device 200 used to determine the write DQ. The trainings may be defined in the JEDEC (joint electron device engineering council) standard. However, an order to perform the trainings, a way to perform the trainings, etc. are not defined in the JEDEC standard. The individual trainings may be performed according to any of a widely known method for performing the individual trainings.

In operation S11, the SoC 100 may perform an initial training of the read DQS/DQ at a fixed level of the reference voltage VREF of the SoC 100. The training of the read DQS/DQ means a training of a skew between the read DQS and the read DQ. In operation S12, the SoC 100 may perform an initial training of the write DQS/DQ at a fixed level of the reference voltage VREF of the memory device 200. The training of the write DQS/DQ means a training of a skew between the write DQS and the write DQ.

In operation S13, the SoC 100 may perform a training of the reference voltage VREF of the SoC 100. In operation S14, the SoC 100 may perform a training of a duty cycle of the clock CK. When operation S13 and operation S14 are completed, trainings of the SoC 100 for reading data stored in the memory device 200 may be completed. In operation S15, the SoC 100 may perform a training of a level of the reference voltage VREF of the memory device 200. When operation S15 is completed, a training of the SoC 100 for writing data to the memory device 200 may be completed.

In operation S16, the SoC 100 may again perform the training of the read DQS/DQ at a level of the reference voltage VREF of the SoC 100 adjusted in operation S13. In operation S17, the SoC 100 may again perform the training of the write DQS/DQ at a level of the reference voltage VREF of the memory device 200 adjusted in operation S15.

Referring to FIG. 2, since the fixed level of the reference voltage VREF of the SoC 100 in operation S11 and the fixed level of the reference voltage VREF of the memory device 200 in operation S12 may not be preferred or optimum, the skew between the read DQS and the read DQ aligned in operation S11 and the skew between the write DQS and the write DQ aligned in operation S12 may not be preferred or optimum. Since the skew between the read DQS and the read DQ aligned in operation S11 and/or the duty cycle of the clock CK in operation S11 may not be preferred or optimum, the level of the reference voltage VREF of the SoC 100 adjusted in operation S13 may not be preferred or optimum. Since the skew between the read DQS and the read DQ aligned in operation S11 and/or the level of the reference voltage VREF of the SoC 100 adjusted in operation S13 may not be preferred or optimum, the duty cycle of the clock CK adjusted in operation S14 may not be preferred or optimum. Since the skew between the write DQS and the write DQ aligned in operation S12 and/or the duty cycle of the clock CK adjusted in operation S14 may not be preferred or optimum, the level of the reference voltage VREF of the memory device 200 adjusted in operation S15 may not be preferred or optimum. In the case where the SoC 100 performs a plurality of trainings in any order as illustrated in FIG. 2, the trainings may have an influence on each other, and thus, a result of the trainings may not be preferred or optimum. In particular, even though an order of trainings which are performed by the SoC 100 is adjusted, a result of the trainings may not still be preferred or optimum.

The SoC 100 according to some example embodiments of the inventive concepts may adjust the duty cycle of the clock CK of the SoC 100, the level of the reference voltage VREF of the SoC 100, and the skew between the read DQS and the read DQ at the same time. The SoC 100 may adjust the level of the reference voltage VREF of the memory device 200 and the skew between the write DQS and the write DQ at the same time. Accordingly, even though an operating characteristic(s) of the SoC 100 mounted on the electronic device 10 and an operating characteristic(s) of the memory device 200 mounted on the electronic device 10 are different from each other, the SoC 100 may set the duty cycle of the clock CK, the level of the reference voltage VREF of the SoC 100, the level of the reference voltage VREF of the memory device 200, the skew between the read DQS and the read DQ, and/or the skew between the write DQS and the write DQ to improved or optimum values. Below, the SoC 100 will be more fully described.

Figure 3:
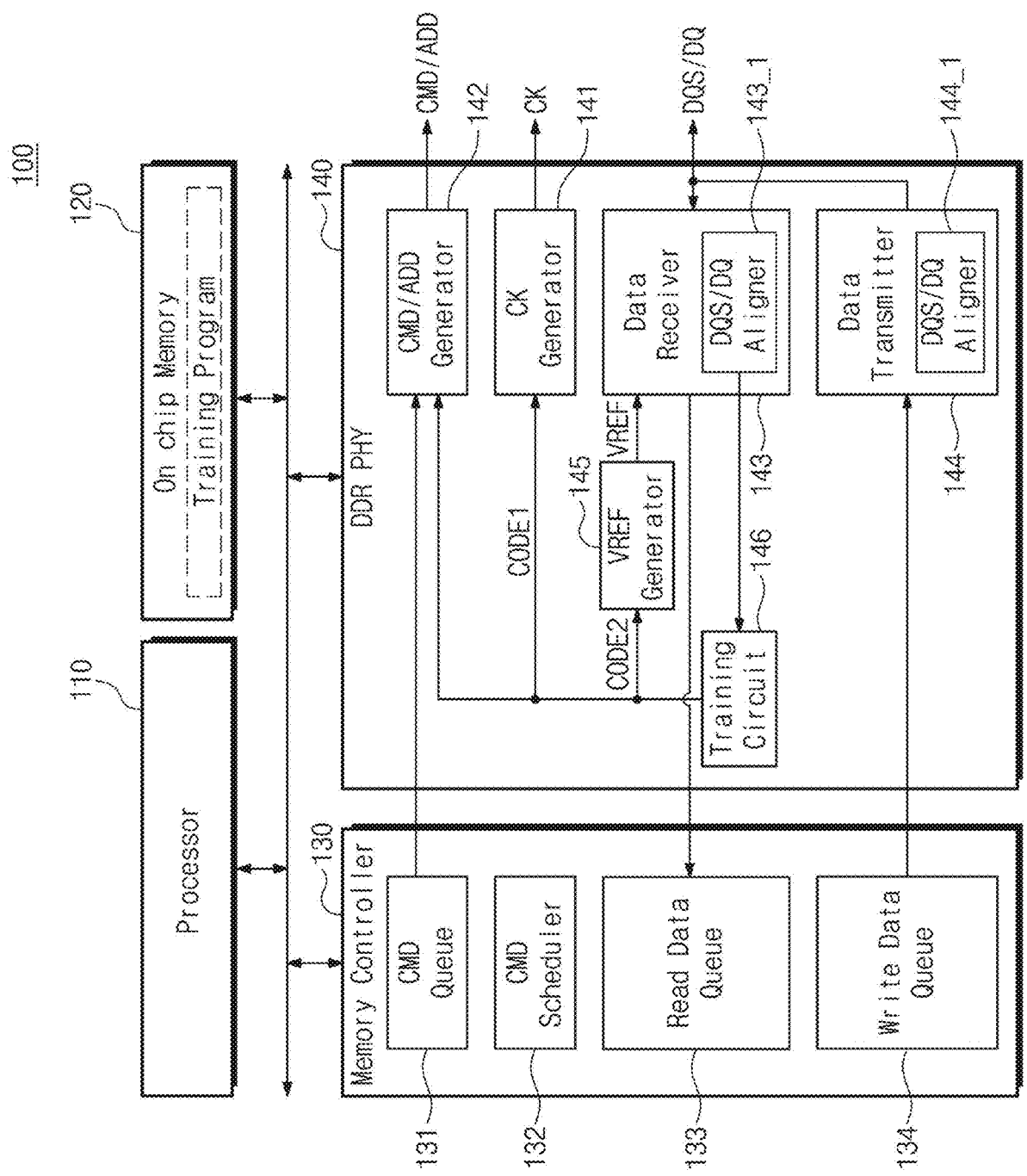
FIG. 3 illustrates a block diagram of a SoC of FIG. 1.

FIG. 3 illustrates a block diagram of a SoC of FIG. 1. The SoC 100 may further include a processor 110 and/or an on chip memory 120 in addition to the memory controller 130 and the DDR PHY 140.

The processor 110 may execute various software (e.g., an application program, an operating system, a file system, and/or a device driver) loaded onto the on chip memory 120. Referring to FIG. 3, the processor 110 may execute a training program loaded onto the on chip memory 120. The processor 110 may include homogeneous multi-core processors and/or heterogeneous multi-core processors. For example, the processor 110 may include at least one of a central processing unit (CPU), an image signal processing unit (ISP), a digital signal processing unit (DSP), a graphics processing unit (GPU), a vision processing unit (VPU), and/or a neural processing unit (NPU).

An application program, an operating system, a file system, a device driver, etc. for driving the electronic device 10 may be loaded onto the on chip memory 120. In particular, referring to FIG. 3, the training program may be loaded onto the on chip memory 120. For example, the on chip memory 120 may be a cache, registers, a tightly coupled memory (TCM), an SRAM device, etc. The on chip memory 120 may be implemented within the SoC 100 and may have a faster data input/output speed than the memory device 200. The on chip memory 120 may be referred to as a "buffer memory".

The memory controller 130 may access the memory device 200 in a direct memory access (DMA) manner. The memory controller 130 may include a command queue 131, a command scheduler 132, a read data queue 133, and/or a write data queue 134.

The command queue 131 may store commands and addresses generated by the processor 110. A command and an address stored in the command queue 131 may be provided to the DDR PHY 140 under control of the command scheduler 132. In this case, one or more commands and one or more addresses stored in the command queue 131 may be provided to the DDR PHY 140 in parallel. The command scheduler 132 may adjust an order of commands and addresses stored in the command queue 131, a time point when a command(s) and an address(es) are input to the command queue 131, a time point when a command(s) and an address(es) are output from the command queue 131, etc.

The read data queue 133 may store read data sent from the memory device 200 through the DDR PHY 140 depending on a read request of the SoC 100 for the memory device 200. The read data stored in the read data queue 133 may be provided to the on chip memory 120 and may be processed by the processor 110. The write data queue 134 may store write data to be stored to the memory device 200. Write data stored in the write data queue 134 depending on a write request of the SoC 100 for the memory device 200 may be sent to the memory device 200 through the DDR PHY 140. For example, the command queue 131, the command scheduler 132, the read data queue 133, and/or the write data queue 134 of the memory controller 130 may be implemented within the SoC 100 in the form of hardware or software or in the form of a combination of hardware and software.

The DDR PHY 140 may include a clock generator 141, a command and address generator 142, a data receiver 143, a data transmitter 144, a reference voltage generator 145, and/or a training circuit 146. The clock generator 141, the command and address generator 142, the data receiver 143, the data transmitter 144, the reference voltage generator 145, and/or the training circuit 146 of the DDR PHY 140 may be implemented within the SoC 100 in the form of hardware (e.g., a logic circuit) or software or in the form of a combination of hardware and software.

The clock generator 141 may generate the clock CK which is output to the memory device 200. The clock generator 141 may adjust a duty cycle of the clock CK depending on a first code CODE1. Unlike illustration of FIG. 3, the clock generator 141 may generate differential clocks CK_t and CK_c and may send the clocks CK_t and CK_c to the memory device 200.

The command and address generator 142 may receive a command or an address from the command queue 131 and may send the command or the address to the memory device 200. For example, the number of command and address transmission paths between the command and address generator 142 and the memory device 200, logical states of signals to be sent through the above-described transmission paths based on a command or an address, a way to send, etc. may be defined in the JEDEC standard of the memory device 200.

The data receiver 143 may receive read data from the memory device 200. The data receiver 143 may provide the received read data to the read data queue 133. The data receiver 143 may include a read DQS/DQ aligner 143_1 which aligns the read DQS and the read DQ and/or adjusts a skew between the read DQS and the read DQ. The read DQS/DQ aligner 143_1 may include a delay locked loop (DLL) which includes a plurality of delay cells. For example, the read DQS/DQ aligner 143_1 may find an improved or optimum sampling point for determining the read DQ at the SoC 100 while delaying the read DQS or the read DQ based on a time unit corresponding to a delay time of one delay cell.

The data transmitter 144 may receive write data from the write data queue 134. The data transmitter 144 may send the received write data to the memory device 200. The data transmitter 144 may include a write DQS/DQ aligner 144_1 which aligns the write DQS and the write DQ and/or adjusts a skew between the write DQS and the write DQ. The write DQS/DQ aligner 144_1 may also include a DLL which includes a plurality of delay cells. The write DQS/DQ aligner 144_1 may find an improved or optimum sampling point for determining the write DQ at the memory device 200 while delaying the write DQS or the write DQ based on a time unit corresponding to a delay time of one delay cell.

The reference voltage generator 145 may generate a reference voltage VREF and may provide the reference voltage VREF to the data receiver 143. The reference voltage generator 145 may adjust a level of the reference voltage VREF depending on a second code CODE2.

The training circuit 146 may operate under control of the training program which is executed by the processor 110 and is stored in the on chip memory 120. The training circuit 146 may receive the aligned read DQS and the aligned read DQ from the read DQS/DQ aligner 143_1 of the data receiver 143 and may calculate a valid window margin (hereinafter referred to as a "VWM"). The VWM may mean a maximum interval in which the data receiver 143 can determine the read DQ output from the memory device 200 by using the read DQS output from the memory device 200. The VWM may indicate an interval capable of validly sampling the read DQ with respect to the read DQS. The VWM will be described with reference to FIG. 4. The training circuit 146 may store the calculated VWM to the on chip memory 120.

The training circuit 146 may adjust, change, and/or calibrate the first code CODE1 and/or the second code CODE2 under control of the training program. The training circuit 146 may control the command and address generator 142 under control of the training program. For example, the command and address generator 142 may generate a read command, a write command, test data, etc. for training, depending on a test pattern of the training program, which may be determined in advance, and may send the read command, the write command, the test data, etc. to the memory device 200.

Figure 4:
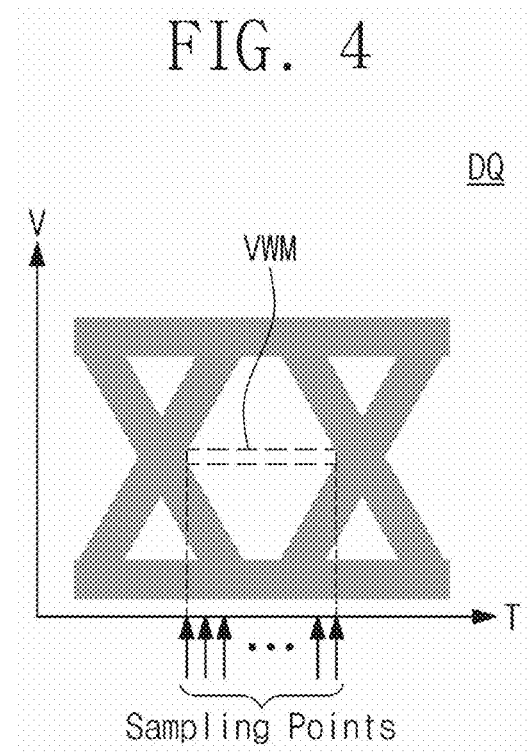
FIG. 4 illustrates a VWM calculated by a training circuit of FIG. 3.

FIG. 4 illustrates a VWM calculated by a training circuit of FIG. 3. In FIG. 4, a horizontal axis represents a time "T", and a vertical axis represents a voltage "V". In FIG. 4, a shaded portion may indicate an eye diagram (or an eye pattern) of the read DQ.

As described above, the training circuit 146 may calculate the VWM of the read DQ. The training circuit 146 may change a time point to determine the read DQ, that is, a sampling point while delaying the read DQS or the read DQ.

The training circuit 146 may find valid sampling points capable of validly sampling the read DQ among a plurality of sampling points and may calculate the VWM of the read DQ from the valid sampling points. For example, all sampling points illustrated in FIG. 4 may be valid sampling points. The training circuit 146 may calculate a difference between two valid sampling points or a value smaller than the difference as the VWM of the read DQ.

Figure 5:
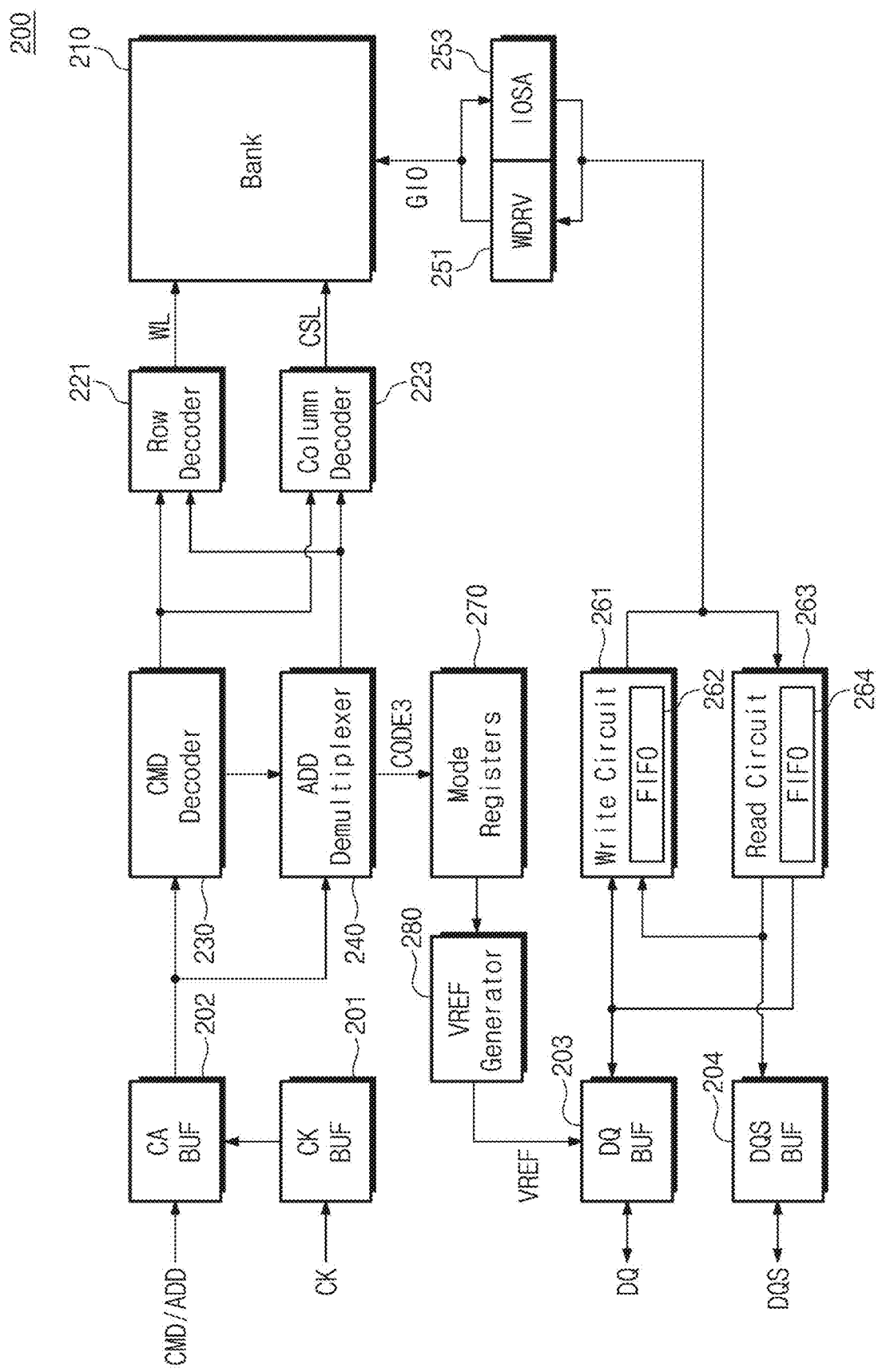
FIG. 5 illustrates a block diagram of a memory device of FIG. 1.

FIG. 5 illustrates a block diagram of a memory device of FIG. 1. The memory device 200 may include a CK buffer 201, a CA buffer 202, a DQ buffer 203, a DQS buffer 204, a bank 210, a row decoder 221, a column decoder 223, a command decoder 230, an address demultiplexer 240, a write driver 251, an input/output sense amplifier 253, a write circuit 261, a read circuit 263, mode registers 270, and/or a reference voltage generator 280. All the above-described components may be implemented within the memory device 200 in the form of hardware.

The CK buffer 201 may receive the clock CK from the SoC 100. The CK buffer 201 may provide the received clock CK to internal components of the memory device 200. As described above, the SoC 100 may send the differential clocks CK_t and CK_c to the memory device 200, and the memory device 200 may include the CK buffers 201 receiving the clocks CK_t and CK_c, respectively.

The CA buffer 202 may receive the command and address CMD/ADD from the SoC 100 based on the clock CK received through the CK buffer 201. The CA buffer 202 may sample the command and address CMD/ADD by using the clock CK. That is, the memory device 200 may be synchronized with the clock CK. The CA buffer 202 may provide the sampled command and address CMD/ADD to the command decoder 230 and/or the address demultiplexer 240.

The DQ buffer 203 may receive the write DQ from the SoC 100 or may output the read DQ to the SoC 100. Since the DQ is a bidirectional signal, the DQ buffer 203 may include both a receiver (not illustrated) receiving the write DQ and a transmitter (not illustrated) outputting the read DQ. For example, the receiver of the DQ buffer 203 may receive the write DQ from the SoC 100 based on the reference voltage VREF. The DQS buffer 204 may receive the write DQS from the SoC 100 or may output the read DQS to the SoC 100. Since the DQS is a bidirectional signal, the DQS buffer 204 may include both a receiver (not illustrated) receiving the write DQS and a transmitter (not illustrated) outputting the read DQS.

In some example embodiments, the number of the buffers 201 to 204 of the memory device 200 is not limited to an example illustrated in FIG. 5. The number of the buffers 201 to 204 may be determined according to a capacity, an operating speed, a bandwidth, etc. of the memory device 200.

The bank 210 may include a memory cell array. The memory cell array may include memory cells connected to word lines and/or bit lines (not illustrated). The number of memory cells of the bank 210 may be determined according to a capacity of the bank 210, and the number of banks 210 may be determined according to a capacity of the memory device 200.

The row decoder 221 may decode a row address under control of the command decoder 230. The row decoder 221 may select and/or activate at least one word line corresponding to the row address. The column decoder 223 may decode a column address under control of the command decoder 230. The column decoder 223 may select and/or activate at least one column selection line corresponding to the column address. Two or more bit lines may be connected to a column selection line. For example, memory cells corresponding to the row address and the column address may be selected, and a data input/output may be performed on the selected memory cells.

The command decoder 230 may decode a command output from the DDR PHY 140 of the SoC 100 and/or may control internal components of the memory device 200. For example, the command decoder 230 may decode an activate command, a read command, a write command, a precharge command, a mode register write command (MRW), a multi-purpose command (MPC), etc. All the above-described commands may be determined in advance in the JEDEC standard.

The address demultiplexer 240 may provide the address ADD received together with the command to internal components of the memory device 200 under control of the command decoder 230. The address demultiplexer 240 may provide an address sent together with the precharge command or the activate command from the SoC 100 to the row decoder 221 as a row address. The address demultiplexer 240 may provide an address sent together with the read command or the write command from the SoC 100 to the column decoder 223 as a column address. The address demultiplexer 240 may provide an address sent together with the mode register write command from the SoC 100 to the mode registers 270 as a third code CODE3. The third code CODE3 may be referred to as an "operation code OPCODE" or an "operand". The address demultiplexer 240 may provide an address sent together with the multi-purpose command to multi-purpose registers (not illustrated), a first-in first-out (FIFO) 262, or a FIFO 264 of the memory device 200. The above-described commands and/or addresses may be defined in the JEDEC standard of the memory device 200. In some example embodiments, an address sent together with a command may include an address of memory cells of the memory device 200, may include an operation code OPCODE to be used to set an operating mode of the memory device 200, and/or may include test data for training to be stored to the FIFO 262 or the FIFO 264, not to the bank 210.

The write driver 251 may receive write data from the write circuit 261 and may write the write data to selected memory cells through an input/output line GIO under control of the command decoder 230. The input/output sense amplifier 253 may sense read data output from the selected memory cells through the input/output line GIO and may provide the read data to the read circuit 263.

The write circuit 261 may receive the write DQS and the write DQ from the SoC 100 through the DQS buffer 204 and the DQ buffer 203. The write circuit 261 may sample and/or desterilize the write DQ by using the write DQS and may store a result of the sampling to the FIFO 262. The write circuit 261 may provide the write data stored in the FIFO 262 to the write driver 251.

The read circuit 263 may receive read data from the input/output sense amplifier 253. The read circuit 263 may store the received read data to the FIFO 264. The read circuit 263 may serialize the read data and/or may send the read DQS and the read DQ to the SoC 100 through the DQS buffer 204 and the DQ buffer 203.

In some example embodiments, the read circuit 263 may store an address sent together with the write command, the multi-purpose command, etc. from the SoC 100 to the FIFO 264, under control of the command decoder 230 decoding the write command, the multi-purpose command, etc. In this case, the address stored in the FIFO 264 may be output to the SoC 100 as data and may not be stored to the bank 210.

Afterwards, the read circuit 263 may output the address stored in the FIFO 264 to the SoC 100 as data, under control of the command decoder 230 decoding the read command.

The mode registers 270 may store the third code CODE3 provided from the address demultiplexer 240. The number of the mode registers 270, an address, a size of the third code CODE3, etc. may be defined in the JEDEC standard. By issuing the mode register write command and an operation code OPCODE (e.g., the third code CODE3 for adjusting a level of the reference voltage VREF of the memory device 200), the SoC 100 may change values stored in the mode registers 270 and/or may set an operating condition, an operating mode, etc. of the memory device 200.

The reference voltage generator 280 may generate the reference voltage VREF and may provide the reference voltage VREF to the DQ buffer 203. The reference voltage VREF may be used for the DQ buffer 203 to determine the write DQ. The reference voltage generator 280 may adjust a level of the reference voltage VREF depending on the third code CODE3 stored in the mode registers 270. The reference voltage generator 280 may provide the reference voltage VREF to the DQS buffer 204 (not illustrated). The reference voltage VREF may be used for the DQS buffer 204 to receive the write DQS.

Figure 6:
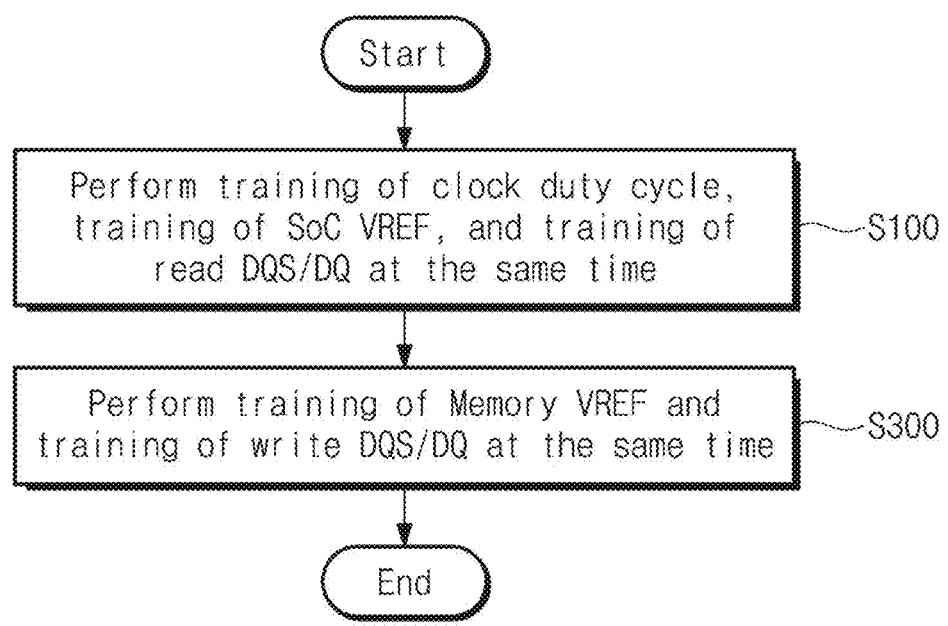
FIG. 6 illustrates a flowchart of operations in which a SoC performs a plurality of trainings, according to some example embodiments of the inventive concepts.

FIG. 6 illustrates a flowchart of operations in which a SoC performs a plurality of trainings, according to some example embodiments of the inventive concepts. FIG. 6 will be described with reference to FIGS. 1, 3, and 5.

In operation S100, the SoC 100 may perform a training of a duty cycle of the clock CK which is adjusted according to the first code CODE1, a training of a level of the reference voltage VREF of the SoC 100 which is adjusted according to the second code CODE2, and a training of a read DQS/DQ at the same time. For example, operation S100 may relate to set the first code CODE1, the second code CODE2, and/or a skew between the read DQS and the read DQ of the SoC 100 so that the SoC 100 may validly read data stored in the memory device 200.

In operation S300, the SoC 100 may simultaneously perform trainings on a level of the reference voltage VREF of the memory device 200 which is adjusted by the third code CODE3 and the write DQS/DQ. For example, operation S300 may relate to set the third code CODE3 and a skew between the write DQS and the write DQ so that the SoC 100 may validly write data to the memory device 200.

Figure 7:
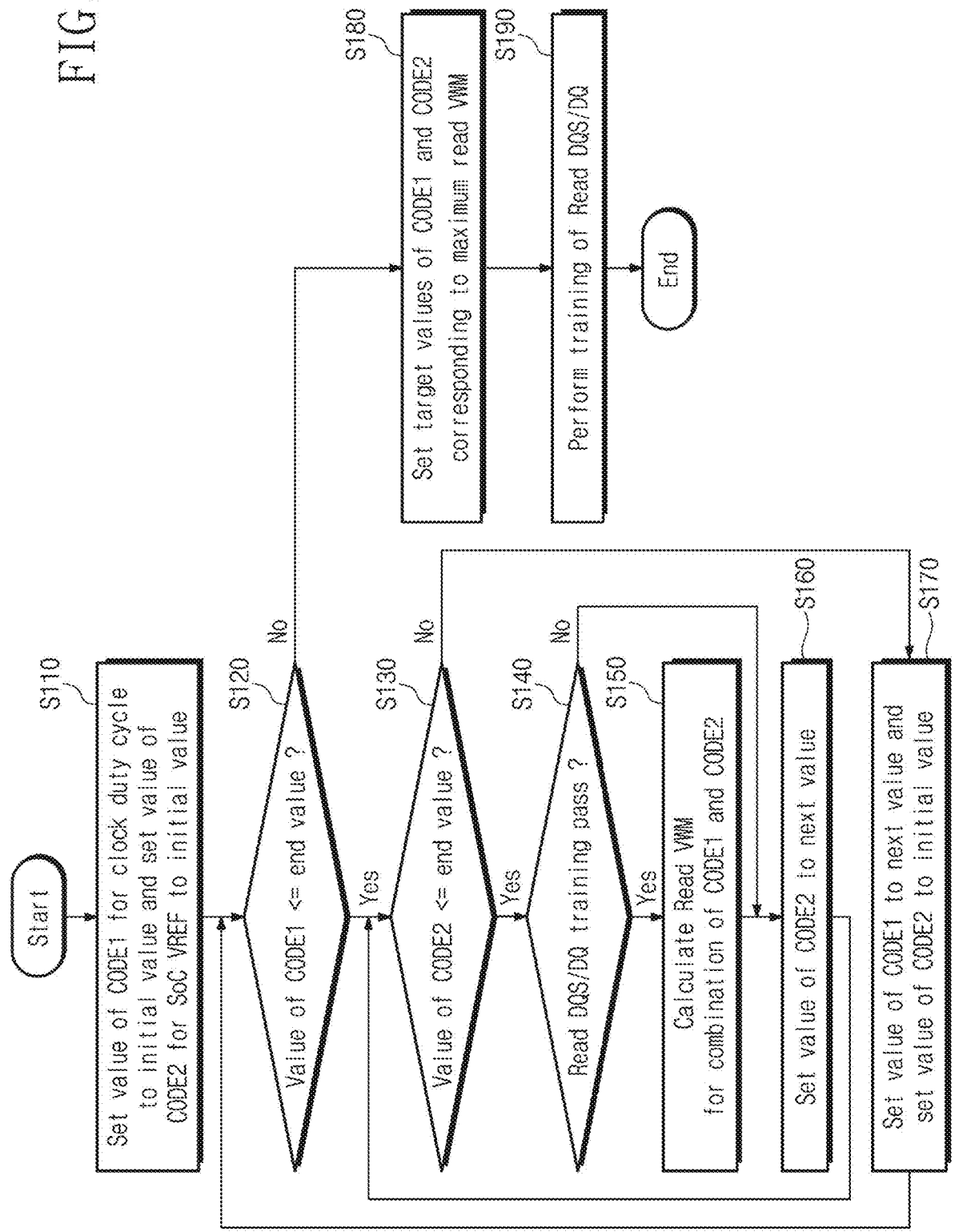
FIG. 7 is a flowchart illustrating operations of operation S100 of FIG. 6, according to some example embodiments.

FIG. 7 is a flowchart illustrating operations of operation S100 of FIG. 6, according to some example embodiments. For example, the processor 110 may perform operation S110 to operation S190 by executing the training program stored in the on chip memory 120.

In operation S110, the SoC 100 may set the first code CODE1 for adjusting a duty cycle of the clock CK to an initial value which may be determined in advance, and may set the second code CODE2 for adjusting a level of the reference voltage VREF of the SoC 100 to an initial value which may be determined in advance. The duty cycle of the clock CK may be set according to the first code CODE1 having the initial value, and the level of the reference voltage VREF of the SoC 100 may be set according to the second code CODE2 having the initial value.

Each of the first code CODE1 and the second code CODE2 may include a plurality of bits. For example, in the case where the first code CODE1 is composed of 3 bits, a value of the first code CODE1 may be any natural number between 0 (=$000_b$) to 7 (=$111_b$), and all values of the first code CODE1 may be 0, 1 . . . 7. The number of the plurality of bits may be determined in advance based on an adjustment unit or an adjustment range of the duty cycle of the clock CK or the reference voltage VREF.

For example, duty cycles of the clock CK which respectively correspond to values of the first code CODE1 may be different from each other. A difference (or a step) between duty cycles of the clock CK may be determined in advance. Also, levels of the reference voltage VREF of the SoC 100 which respectively correspond to values of the second code CODE2 may be different from each other. A difference (or a step) between levels of the reference voltage VREF of the SoC 100 may be determined in advance.

In operation S120, the SoC 100 may determine whether a value of the first code CODE1 exceeds an end value. The end value may be set in advance to any value (e.g., a maximum value or a minimum value of the first code CODE1) of values of the first code CODE1. Operation S120 may be repeatedly performed until read VWMs associated with all values which the first code CODE1 may have are calculated. When the value of the first code CODE1 does not exceed the end value (Yes), operation S130 may be performed; if not (No), operation S180 may be performed. In operation S120 of FIG. 7, an inequality sign is only exemplary. That is, when read VWMs associated with all values which the first code CODE1 may have are not calculated, operation S130 may be performed; if not, operation S180 may be performed.

In operation S130, the SoC 100 may determine whether a value of the second code CODE2 exceeds an end value. The end value may be set in advance to any value (e.g., a maximum value or a minimum value of the second code CODE2) of values of the second code CODE2. Operation S130 may be repeatedly performed until read VWMs associated with all values which the second code CODE2 may have are calculated. When the value of the second code CODE2 does not exceed the end value (Yes), operation S140 may be performed; if not (No), operation S170 may be performed. In operation S130 of FIG. 7, an inequality sign is only exemplary. That is, when read VWMs associated with all values which the second code CODE2 may have are not calculated, operation S140 may be performed; if not, operation S170 may be performed.

In operation S140, the SoC 100 may determine whether a training of the read DQS/DQ is passed. That the training of the read DQS/DQ is passed means that the read DQ may be validly sampled by using the read DQS. In detail, the read DQS/DQ aligner 143_1 of the data receiver 143 of the SoC 100 may align the read DQS and the read DQ, for sampling, when one of the first code CODE1 and the second code CODE2 is changed. When the training of the read DQS/DQ is passed (Yes), operation S150 may be performed; if not (No), operation S160 may be performed.

In operation S150, the SoC 100 may calculate a read VWM associated with a combination of the first code CODE1 and the second code CODE2 based on the read DQS and the read DQ aligned by the read DQS/DQ aligner 143_1. The combination may be a pair of one of values of the first code CODE1 and one of values of the second code CODE2. For example, the combination corresponding to the case where operation S150 is performed for the first time may be a pair of initial values of the first code CODE1 and the second code CODE2. The combination corresponding to the case where operation S150 is again performed next may be a pair of an initial value of the first code CODE1 and a next value of the second code CODE2. Read VWMs associated with all combinations of the first code CODE1 and the second code CODE2 may be calculated in the above-described manner.

In some example embodiments, the SoC 100 may send a write command and a read command to the memory device 200 based on a test pattern of the training program, which may be determined in advance, to receive the read DQS and the read DQ from the memory device 200. For example, the data transmitter 144 may not operate when the write command is output from the SoC 100 depending on the test pattern. The command and address generator 142 may send the write command and test data, which may be determined in advance, to the memory device 200 through the command and address transmission paths. The memory device 200 may decode the write command according to the test pattern and may immediately store the test data, which may be determined in advance, to the FIFO 264, not to the bank 210. The write command of the test pattern may be different from a write command for writing data to the bank 210 and/or may be the multi-purpose command.

In operation S160, the SoC 100 may set or change a value of the second code CODE2 to a next value. The SoC 100 may change a value of the second code CODE2 in various manners. For example, the SoC 100 may sequentially increase or decrease a value of the second code CODE2. A difference between the previous value of the second code CODE2 and the next value of the second code CODE2 may be a value corresponding to a least significant bit (LSB) of the second code CODE2. A level of the reference voltage VREF of the SoC 100 may be set according to the second code CODE2 having the next value. For example, a difference (or a step) between a level of the reference voltage VREF of the SoC 100 corresponding to the previous value of the second code CODE2 and a level of the reference voltage VREF of the SoC 100 corresponding to the next value of the second code CODE2 may be a value determined in advance.

In operation S170, the SoC 100 may set and/or change a value of the first code CODE1 to a next value. The SoC 100 may change a value of the first code CODE1 in various manners. For example, the SoC 100 may sequentially increase or decrease a value of the first code CODE1. A difference between the previous value of the first code CODE1 and the next value of the first code CODE1 may be a value corresponding to an LSB of the first code CODE1. The duty cycle of the clock CK may be set according to the first code CODE1 having a next value. For example, a difference (or a step) between a duty cycle of the clock CK corresponding to the previous value of the first code CODE1 and a duty cycle of the clock CK corresponding to the next value of the first code CODE1 may be a value determined in advance.

The SoC 100 may change a value of the first code CODE1 to the next value in operation S170 and may repeatedly change a value of the second code CODE2 while maintaining the changed value of the first code CODE1. The SoC 100 may calculate read VWMs respectively associated with all combinations of one value of the first code CODE1 and all values of the second code CODE2. When the read DQS/DQ training is not passed with regard to a particular combination, the SoC 100 does not calculate a read VWM associated with the particular combination (refer to a "No" case of operation S140). Referring to FIG. 7, the SoC 100 may calculate read VWMs respectively associated with combinations of all values of the first code CODE1 and all values of the second code CODE2 by repeatedly performing operation S120 to operation S170.

In operation S180, the SoC 100 may find a maximum read VWM of the plurality of read VWMs calculated by repeatedly performing operation S120 to operation S170. A target value of the first code CODE1 and a target value of the second code CODE2 corresponding to the maximum read VWM may be respectively provided to the clock generator 141 and the reference voltage generator 145. Accordingly, a duty cycle of the clock CK may be set or adjusted according to the target value of the first code CODE1, and a level of the reference voltage VREF of the SoC 100 may be set or adjusted according to the target value of the second code CODE2.

In operation S190, the SoC 100 may again perform the read DQS/DQ training at the duty cycle of the clock CK corresponding to the target value of the first code CODE1 and the level of the reference voltage VREF corresponding to the target value of the second code CODE2. The SoC 100 may again align the read DQS and the read DQ. By completing operation S190, the SoC 100 may complete the training of the duty cycle of the clock CK, the training of the level of the reference voltage VREF of the SoC 100, and the training of the read DQS/DQ at the same time.

Figure 8:
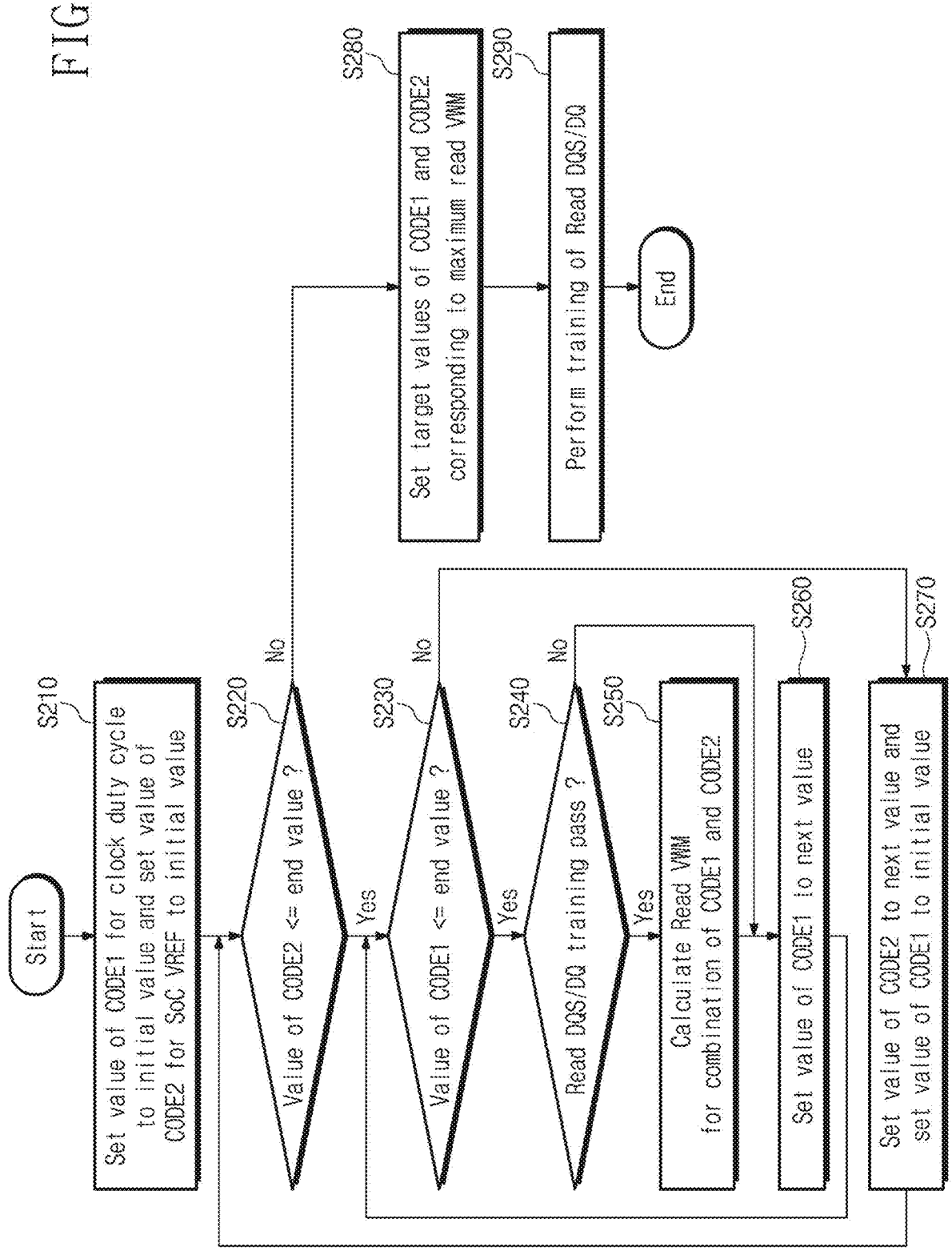
FIG. 8 is a flowchart illustrating operations of operation S100 of FIG. 6, according to some example embodiments.

FIG. 8 is a flowchart illustrating operations of operation S100 of FIG. 6, according to another embodiment. FIG. 8 will be described with reference to FIG. 7. Operation S210, operation S240, operation S250, operation S260, operation S270, operation S280, and operation S290 of FIG. 8 are substantially identical to operation S110, operation S140, operation S150, operation S160, operation S170, operation S180, and operation S190 of FIG. 7.

Operation S220 may be substantially identical to operation S130 of FIG. 7, and operation S230 may be substantially identical to operation S120 of FIG. 7. According to the flowchart of FIG. 8, the SoC 100 may repeatedly change a value of the first code CODE1 while maintaining a value of the second code CODE2. According to the flowchart of FIG. 7, the SoC 100 may repeatedly change a value of the second code CODE2 while maintaining a value of the first code CODE1. Regardless of any case of FIGS. 7 and 8, the SoC 100 according to some example embodiments of the inventive concepts may calculate read VWMs respectively associated with all combinations of all values of the first code CODE1 and all values of the second code CODE2.

Figure 9:
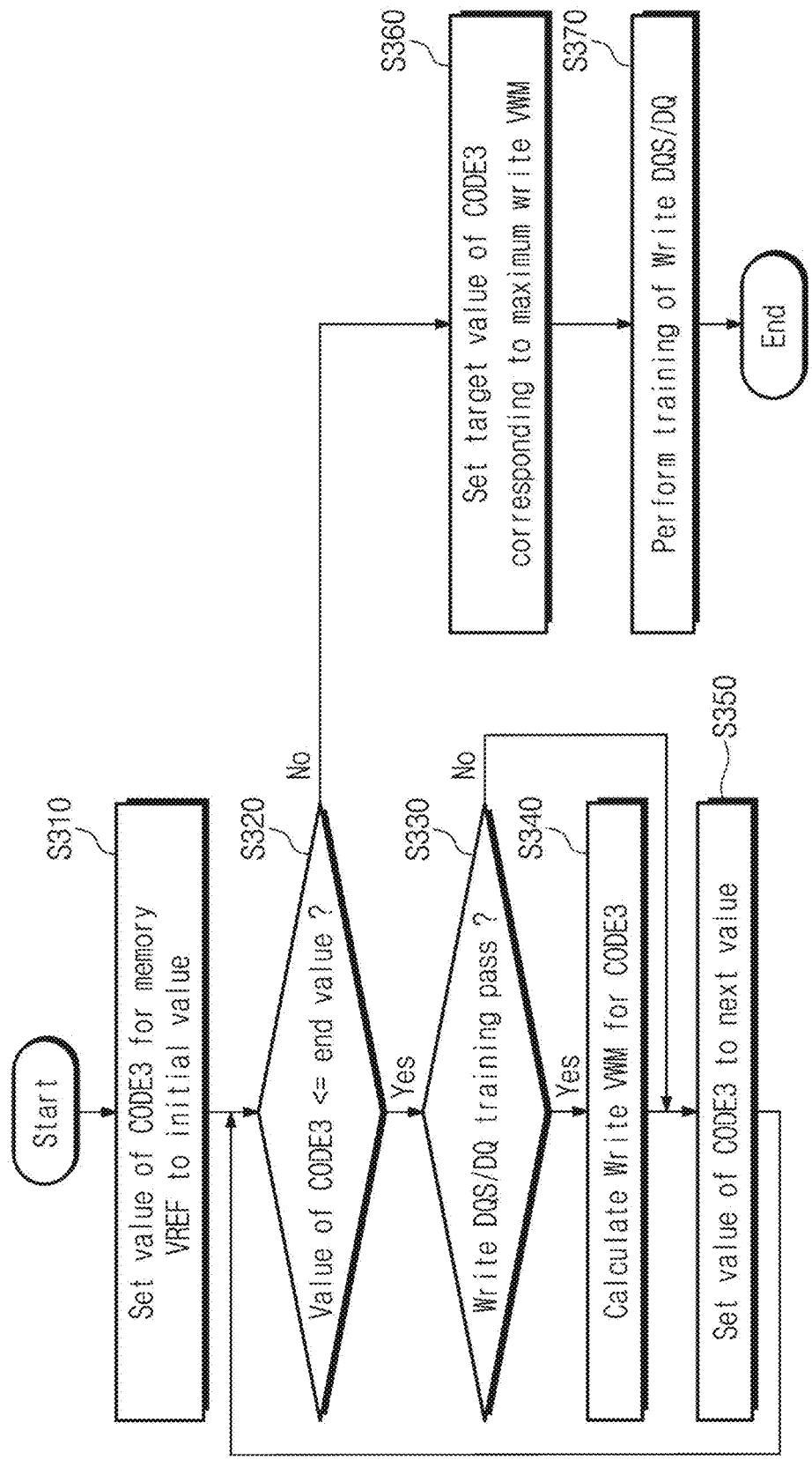
FIG. 9 is a flowchart illustrating operations of operation S300 of FIG. 6, according to some example embodiments.

FIG. 9 is a flowchart illustrating operations of operation S300 of FIG. 6, according to some example embodiments. For example, the processor 110 may perform operation S310 to operation S370 by executing the training program stored in the on chip memory 120. Also, operation S310 to operation S370 may be performed at the duty cycle of the clock CK set according to a target value of the first code CODE1 and a level of the reference voltage VREF of the SoC 100 set according to a target value of the second code CODE2.

In operation S310, the SoC 100 may set a third code CODE3 for adjusting a level of the reference voltage VREF of the memory device 200 to an initial value, which may be determined in advance. The command and address generator 142 of the SoC 100 may generate a command for adjusting the level of the reference voltage VREF of the memory device 200 and may send the command and the third code CODE3 having the initial value to the memory device 200. As in the first code CODE1 and the second code CODE2, the third code CODE3 may include a plurality of bits. Levels of the reference voltage VREF of the memory device 200 which respectively correspond to values of the third code CODE3 may be different from each other. A difference (or a step) between levels of the reference voltage VREF of the memory device 200 may be a value which may be determined in advance.

The initial value of the third code CODE3 may be stored to the mode registers 270 and/or multi-purpose registers of the memory device 200. The SoC 100 may send, to the memory device 200, the initial value of the third code CODE3 and a command (e.g., a mode register write command or a multi-purpose command) for storing the initial value of the third code CODE3 to the mode registers 270 and/or the multi-purpose registers of the memory device 200 together.

In operation S320, the SoC 100 may determine whether a value of the third code CODE3 exceeds an end value. The end value may be set in advance set to any value (e.g., a maximum value or a minimum value of the third code CODE3) of values of the third code CODE3. The operation S320 may be repeatedly performed until write VWMs associated with all values which the third code CODE3 may have are calculated. When the value of the third code CODE3 does not exceed the end value (Yes), operation S330 may be performed; if not (No), operation S360 may be performed. In operation S320 of FIG. 9, an inequality sign is only exemplary. That is, when write VWMs associated with all values which the third code CODE3 may have are not calculated, operation S330 may be performed; if not, operation S360 may be performed.

In operation S330, the SoC 100 may determine whether a training of the write DQS/DQ is passed. The training of the write DQS/DQ of operation S330 is different from the training of the read DQS/DQ of operation S140. The above-described training of the read DQS/DQ may be an operation in which the read DQS and the read DQ to be output from the memory device 200 are aligned by the read DQS/DQ aligner 143_1 of the data receiver 143. In contrast, the training of the write DQS/DQ may be an operation in which the write DQS and the write DQ to be output to the memory device 200 are aligned by the write DQS/DQ aligner 144_1 of the data transmitter 144. In operation S330, the read DQS and the read DQ are aligned in operation S190 described above.

That the training of the write DQS/DQ is passed means that the SoC 100 validly samples the read DQ output from the memory device 200 by using the read DQS output from the memory device 200 after the memory device 200 receives the write DQS and the write DQ output from the data transmitter 144. The SoC 100 may repeatedly send a write command and a read command to the memory device 200 for performing a training of the write DQS/DQ. In detail, when the third code CODE3 is changed, the write DQS/DQ aligner 144_1 of the data transmitter 144 of the SoC 100 may align the write DQS and the write DQ to be output to the memory device 200. When the training of the write DQS/DQ is passed (Yes), operation S340 may be performed; if not (No), operation S350 may be performed.

In operation S340, the SoC 100 may calculate a write VWM associated with the third code CODE3 based on the read DQS and the read DQ output from the memory device 200 receiving the write DQS and the write DQ aligned by the write DQS/DQ aligner 144_1. Here, the read DQS and the read DQ output from the memory device 200 may be aligned by the DQS/DQ aligner 143_1 set through the training of operation S190.

In some example embodiments, the training circuit 146 may respectively calculate the write VWM of operation S340 and the read VWM of operation S150 based on the read DQS and the read DQ. The read VWM indicates the VWM calculated in operation S150 of FIG. 7, and the write VWM indicates the VWM calculated in operation S340 of FIG. 9. The read VWM may be calculated based on the read DQS and the read DQ generated from the memory device 200 through a training which the SoC 100 performs, to read data stored in the memory device 200. The write VWM may be calculated based on the read DQS and the read DQ generated from the memory device 200 receiving the write DQS and the write DQ through a training which the SoC 100 performs, to write data to the memory device 200.

In some example embodiments, the SoC 100 may send a write command and a read command to the memory device 200 based on a test pattern of the training program which may be determined in advance, to send the write DQS and the write DQ to the memory device 200. For example, the command and address generator 142 may send the write command to the memory device 200 through the command and address transmission paths. In addition to the write command, the data transmitter 144 may send the write DQS and the write DQ, which are based on test data, which may be determined in advance, to the memory device 200. For example, a write command of the test pattern may be a write command for writing the test data to the bank 210. For another example, the write command of the test pattern may be the multi-purpose command for immediately storing the test data to the FIFO 264, not to the bank 210.

In operation S350, the SoC 100 may set or change a value of the third code CODE3 to a next value. The SoC 100 may change a value of the third code CODE3 in various manners. For example, the SoC 100 may sequentially increase or decrease a value of the third code CODE3. A difference between the previous value of the third code CODE3 and the next value of the third code CODE3 may be a value corresponding to an LSB of the third code CODE3. A level of the reference voltage VREF of the memory device 200 may be set according to the third code CODE3 having the next value. For example, a difference (or a step) between a level of the reference voltage VREF of the memory device 200 corresponding to the previous value of the third code CODE3 and a level of the reference voltage VREF of the memory device 200 corresponding to the next value of the third code CODE3 may be a value which may be determined in advance. The SoC 100 may calculate write VWMs respectively associated with values of the third code CODE3. When the write DQS/DQ training is not passed with regard to a value, the SoC 100 does not calculate a write VWM associated with the value.

In operation S360, the SoC 100 may find a maximum write VWM of the plurality of write VWMs calculated by repeatedly performing operation S320 to operation S350. A target value of the third code CODE3 corresponding to the maximum write VWM may be provided to the mode registers 270 and/or the multi-purpose registers of the memory device 200 together with a command. Accordingly, a level of the reference voltage VREF of the memory device 200 may be set or adjusted according to the target value of the third code CODE3.

In operation S370, the SoC 100 may again perform the write DQS/DQ training at the level of the reference voltage VREF corresponding to the target value of the third code CODE3. The SoC 100 may again align the write DQS and the write DQ. By completing operation S370, the SoC 100 may complete the training of the level of the reference voltage VREF of the memory device 200 and the training of the write DQS/DQ at the same time.

Figure 10:
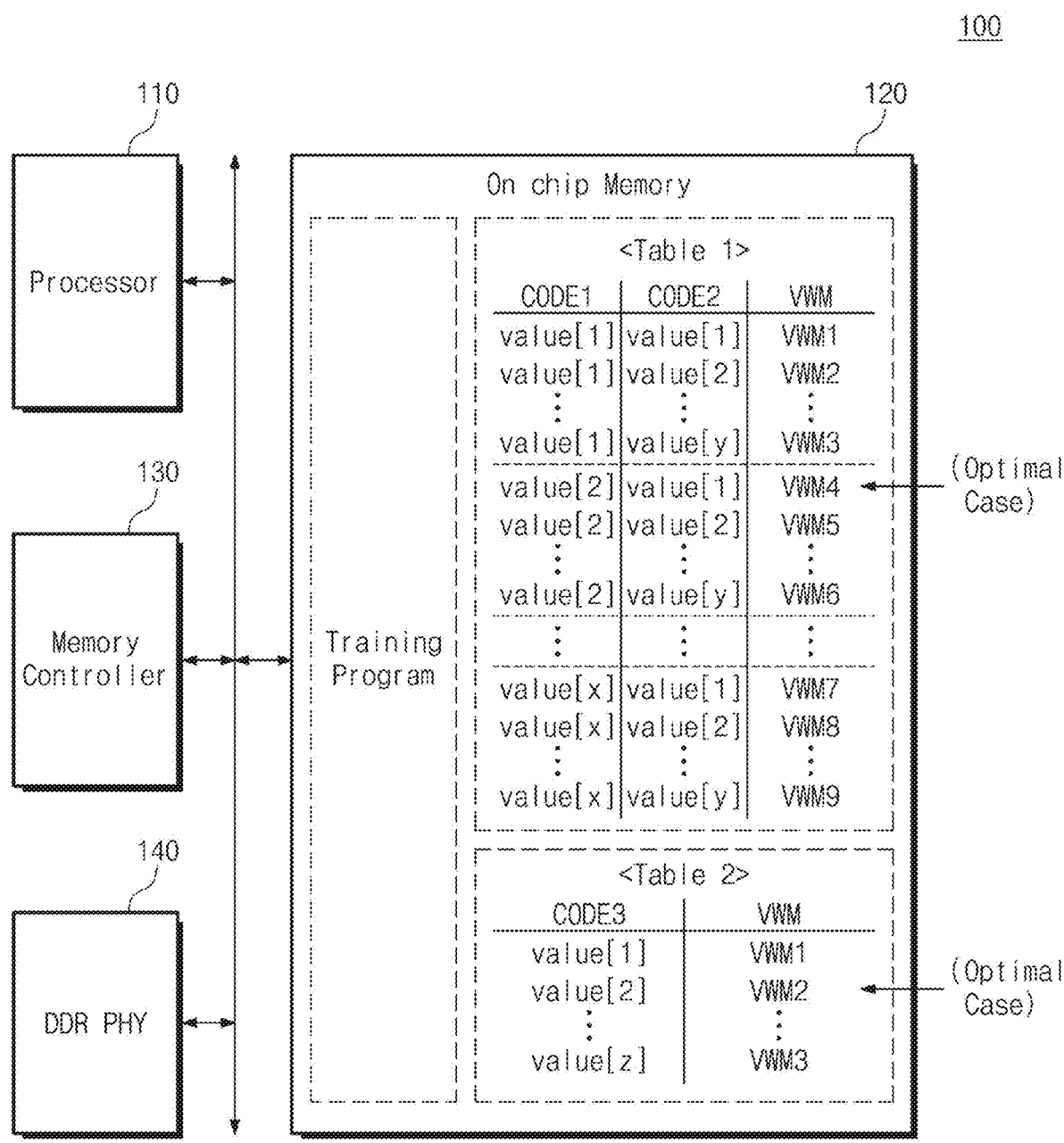
FIG. 10 illustrates read VWMs and write VWMs stored in a SoC depending on flowcharts of FIGS. 6 to 9.

FIG. 10 illustrates read VWMs and write VWMs stored in a SoC depending on flowcharts of FIGS. 6 to 9. For convenience of illustration, components of the memory controller 130 and components of the DDR PHY 140 are omitted in FIG. 10.

Table 1 stored in the on chip memory 120 may be a result of performing operation S100 of FIG. 6, operation S110 to operation S190 of FIG. 7, and/or operation S210 to operation S290 of FIG. 8. For example, the first code CODE1 may have values value[1], value[2] ... value[x] (x being a natural number of 2 or more), and the second code CODE2 may have values value[1], value[2] ... value[y] (y being a natural number of 2 or more). Here, "x" and "y" may be identical to or different from each other. Referring to Table 1, a plurality of read VWMs VWM1 to VWM9 respectively associated with combinations of all values value[1], value[2] ... value[x] of the first code CODE1 and all values value[1], value[2] ... value[y] of the second code CODE2 may be calculated by the training program executed by the processor 110.

For example, when VWM4 of the plurality of read VWMs VWM1 to VWM9 is maximum, a target value of the first code CODE1 may be value [2] and a target value of the second code CODE2 may be value [1]. The training program may complete the trainings of operation S100 by setting the first code CODE1 to value[2] and the second code CODE2 to value[1].

Table 2 stored in the on chip memory 120 may be a result of performing operation S300 of FIG. 6 and/or operation S310 to operation S370 of FIG. 9. For example, the third code CODE3 may have values value[1], value[2] ... value[z] (z being a natural number of 2 or more). Here, "z" may be identical to or different from any one of "x" and y". Referring to Table 2, a plurality of write VWMs VWM1 to VWM3 respectively associated with all the values value[1], value[2] ... value[z] of the third code CODE3 may be calculated by the training program executed by the processor 110.

For example, when VWM2 of the plurality of write VWMs VWM1 to VWM3 is maximum, a target value of the third code CODE3 may be value[2] (e.g., in an optimum case). The training program may complete the trainings of operation S300 by setting the third code CODE3 to value[2].

According to some example embodiments of the inventive concepts, a SoC may simultaneously perform a plurality of trainings, which depend on each other, on a memory device and may set a duty cycle of a clock, a level of a reference voltage of the SoC, a level of a reference voltage of the memory device, a skew between a read DQS and a read DQ, and/or a skew between a write DQS and a write DQ to improved or optimum values.

While the inventive concepts have been described with reference to example embodiments thereof, it will be apparent to those of ordinary skill in the art that various changes and/or modifications may be made thereto without departing from the spirit and/or scope of the inventive concepts as set forth in the following claims.

What is claimed is:

1. An operating method of a system on chip connected with a memory device, the method comprising:
   changing one of a first code for adjusting a duty cycle of a clock to be provided to the memory device or a second code for adjusting a first level of a first reference voltage of the system on chip used to determine a first data input/output signal output from the memory device;
   aligning a first data strobe signal and the first data input/output signal output from the memory device;
   calculating a plurality of read valid window margins for a plurality of combinations, each one of the plurality of combinations being a pair of one of values of the first code and one of values of the second code, based on the first data strobe signal and the first data input/output signal; and setting the duty cycle of the clock and the first level of the first reference voltage of the system on chip, respectively, based on a first target value of the first code and a second target value of the second code corresponding to a maximum read valid window margin of the plurality of read valid window margins, wherein the changing the one of the first code or the second code, the aligning the first data strobe signal and the first data input/output signal, and the setting the duty cycle, are performed simultaneously.

2. The method of claim 1, wherein the changing of the one of the first code and the second code includes:

changing the first code to a first value and repeatedly changing the second code while maintaining the first code at the first value; and changing the first code from the first value to a second value and repeatedly changing the second code while maintaining the first code at the second value.

3. The method of claim 1, wherein the changing of the one of the first code and the second code includes changing the second code to a first value and repeatedly changing the first code while maintaining the second code at the first value, and changing the second code from the first value to a second value and repeatedly changing the first code while maintaining the second code at the second value.

4. The method of claim 1, further comprising setting a third code for adjusting a second level of a second reference voltage of the memory device, changing the third code and aligning a second data strobe signal and a second data input/output signal to be output to the memory device, calculating a plurality of write valid window margins for the third code based on the first data strobe signal and the first data input/output signal, and setting the second level of the second reference voltage of the memory device depending on a third target value of the third code corresponding to a maximum write valid window margin of the plurality of write valid window margins.

5. The method of claim 4, wherein, after the duty cycle of the clock and the first level of the first reference voltage of the system on chip are respectively set according to the first target value of the first code and the second target value of the second code, the second level of the second reference voltage of the memory device is set according to third target value of the third code.

6. A system on chip comprising:

a clock generator configured to adjust a duty cycle of a clock to be output to a memory device depending on a first code;

a reference voltage generator configured to adjust a first level of a first reference voltage used to determine a first data input/output signal output from the memory device depending on a second code;

a data receiver configured to align a first data strobe signal and the first data input/output signal output from the memory device, when one of the first code and the second code is changed; and a processor configured to calculate a plurality of read valid window margins for a plurality of combinations of the first code and the second code based on the first data strobe signal and the first data input/output signal, wherein the aligning the first data strobe signal and the first data input/output signal, the adjusting the duty cycle, and the adjusting the first level, are performed simultaneously.

7. The system on chip of claim 6, wherein each of the plurality of combinations is a pair of one of values of the first code and one of values of the second code.

8. The system on chip of claim 7, wherein the processor is further configured to determine whether the first data strobe signal and the first data input/output signal output from the memory device depending on a first value of the first code and a second value of the second code are aligned by the data receiver, and calculate one of the plurality of read valid window margins corresponding to a pair of the first value and the second value in response to the determination.

9. The system on chip of claim 6, wherein the duty cycle of the clock and the first level of the first reference voltage are respectively set according to a first target value of the first code and a second target value of the second code, wherein the first target value of the first code and the second target value of the second code correspond to a maximum read valid window margin of the plurality of read valid window margins.

10. The system on chip of claim 9, wherein the data receiver is further configured to again align the first data strobe signal and the first data input/output signal output from the memory device at the duty cycle of the clock corresponding to the first target value and the first level of the first reference voltage corresponding to the second target value.

11. The system on chip of claim 9, further comprising:

a data transmitter configured to send a second data strobe signal and a second data input/output signal to the memory device through paths where the first data strobe signal and the first data input/output signal are respectively sent from the memory device to the data receiver.

12. The system on chip of claim 11, wherein the processor is further configured to generate a command for adjusting a second level of a second reference voltage of the memory device used to determine the second data input/output signal, after the duty cycle of the clock and the level of the reference voltage are respectively set according to the first target value and the second target value.

13. The system on chip of claim 12, wherein the second level of the second reference voltage of the memory device is adjusted according to a third code, the third code being transmitted to the memory device together with the command, the data transmitter is further configured to align the second data strobe signal and the second data input/output signal to be output to the memory device, in response to the third code being changed, and the processor is further configured to calculate a plurality of write valid window margins for the third code based on the first data strobe signal and the first data input/output signal.

14. The system on chip of claim 13, wherein the reference voltage generator is further configured to set the second level of the second reference voltage of the memory device according to a third target value of the third code corresponding to a maximum write valid window margin of the plurality of write valid window margins.

15. The system on chip of claim 14, wherein the data transmitter is further configured to again align the second data strobe signal and the second data input/output signal to be output to the memory device at the second level of the second reference voltage of the memory device.

16. An electronic device comprising:
a system on chip configured to generate a clock; and
a memory device synchronized with an output from the clock,
wherein the system on chip is further configured to simultaneously perform
a first training of a duty cycle of the clock adjusted according to a first code,
a second training of a first level of a first reference voltage of the system on chip which is adjusted according to a second code and is used to determine a first data input/output signal output from the memory device, and
a third training of a first skew between a first data strobe signal and the first data input/output signal output from the memory device.

17. The electronic device of claim 16, wherein the system on chip is further configured to
change one of the first code and the second code,
align the first data strobe signal and the first data input/output signal,
calculate a plurality of read valid window margins for a plurality of combinations of the first code and the second code, and
set the duty cycle of the clock and the first level of the first reference voltage of the system on chip respectively based on a first target value of the first code and a second target value of the second code, the first target value and the second target value corresponding to a maximum read valid window margin of the plurality of read valid window margins.

18. The electronic device of claim 16, wherein the system on chip is further configured to simultaneously perform
a third training of a second level of a second reference voltage of the memory device, the second level of the second reference voltage being adjusted according to a third code and being used to determine a second data input/output signal output from the system on chip, and
a fourth training of a second skew between a second data strobe signal and the second data input/output signal to be output to the memory device.

19. The electronic device of claim 18, wherein the system on chip is further configured to
change the third code,
align the second data strobe signal and the second data input/output signal,
calculate a plurality of write valid window margins for the third code based on the first data strobe signal and the first data input/output signal, and
set the second level of the second reference voltage of the memory device depending on a third target value of the third code.

20. The electronic device of claim 18, wherein the memory device is a dynamic random access memory (DRAM) device, and
the system on chip is further configured to generate a mode register write command which stores a third target value to a mode register of the memory device.

* * * * *